US009812844B2

(12) United States Patent
Gomez-Iglesias et al.

(10) Patent No.: US 9,812,844 B2
(45) Date of Patent: Nov. 7, 2017

(54) EDGE-EMITTING SEMICONDUCTOR LASER AND METHOD FOR THE PRODUCTION THEREOF

(71) Applicant: OSRAM Opto Semiconductors GmbH, Regensburg (DE)

(72) Inventors: Alvaro Gomez-Iglesias, Regensburg (DE); Harald König, Bernhardswald (DE); Christian Lauer, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 15 days.

(21) Appl. No.: 14/895,542

(22) PCT Filed: Jun. 17, 2014

(86) PCT No.: PCT/EP2014/062741
§ 371 (c)(1),
(2) Date: Dec. 3, 2015

(87) PCT Pub. No.: WO2014/202619
PCT Pub. Date: Dec. 24, 2014

(65) Prior Publication Data
US 2016/0141837 A1    May 19, 2016

(30) Foreign Application Priority Data

Jun. 21, 2013   (DE) ................. 10 2013 211 851

(51) Int. Cl.
*H01S 5/20*   (2006.01)
*H01S 5/10*   (2006.01)
*H01S 5/32*   (2006.01)

(52) U.S. Cl.
CPC .......... *H01S 5/2031* (2013.01); *H01S 5/1014* (2013.01); *H01S 5/1082* (2013.01);
(Continued)

(58) Field of Classification Search
CPC ...... H01S 5/1014; H01S 5/106; H01S 5/2031; H01S 5/3218
See application file for complete search history.

(56) References Cited

U.S. PATENT DOCUMENTS 5,323,476 A     6/1994  Mueller et al.
6,037,189 A *   3/2000  Goto ................ G02B 6/122
                                                    117/956
(Continued)

FOREIGN PATENT DOCUMENTS

DE   10 2008 025 922 A1   12/2009
EP    1 601 028 A1   11/2005
(Continued)

*Primary Examiner* — Michael Carter
(74) *Attorney, Agent, or Firm* — DLA Piper LLP (US)

(57) ABSTRACT

An edge-emitting semiconductor laser includes a semiconductor structure having a waveguide layer with an active layer, the waveguide layer extending in a longitudinal direction between first and second side facets of the semiconductor structure, the semiconductor structure has a tapering region adjacent to the first side facet, a thickness of the waveguide layer in the tapering region increases longitudinally, the waveguide layer is arranged between first and second cladding layers, a thickness of the second cladding layer in the tapering region of the semiconductor structure increases longitudinally, the tapering region includes first and second subregions, the first subregion is arranged closer to the first side facet than the second subregion, thickness of the waveguide layer increases longitudinally in the first subregion, thickness of the waveguide layer is constant in the longitudinal direction in the second subregion, and thickness of the second cladding layer increases longitudinally in the second subregion.

11 Claims, 4 Drawing Sheets

(52) U.S. Cl.
CPC ............ *H01S 5/209* (2013.01); *H01S 5/3213* (2013.01); *H01S 2301/18* (2013.01)

(56) References Cited

U.S. PATENT DOCUMENTS

| | | | | |
|---|---|---|---|---|
| 6,052,397 | A * | 4/2000 | Jeon ..................... | G02B 6/1228 |
| | | | | 372/46.01 |
| 6,167,070 | A * | 12/2000 | Sakata ................... | B82Y 20/00 |
| | | | | 257/14 |
| 2003/0031416 | A1 | 2/2003 | Akulova et al. | |
| 2011/0122907 | A1 | 5/2011 | Schmid et al. | |

FOREIGN PATENT DOCUMENTS

| | | |
|---|---|---|
| FR | 2 854 469 A1 | 11/2004 |
| JP | 60-037191 A | 2/1985 |
| JP | 10-051066 A | 2/1998 |
| JP | 11-220217 A | 8/1999 |
| WO | 2009/143813 A1 | 12/2009 |

\* cited by examiner

EDGE-EMITTING SEMICONDUCTOR LASER AND METHOD FOR THE PRODUCTION THEREOF

TECHNICAL FIELD

This disclosure relates to an edge-emitting semiconductor laser and a method of producing an edge-emitting semiconductor laser.

BACKGROUND

Edge-emitting semiconductor lasers are known. In particular, in edge-emitting semiconductor lasers, optically induced damage (catastrophic optical damage; COD) may take place in the region of an active layer on a laser facet emitting laser radiation. In this case, nonradiative recombination processes at the surface defects lead to local overheating, which damages the laser facet. To avoid the occurrence of such optically induced damage, the maximum output optical power of known edge-emitting semiconductor lasers must be limited.

It could therefore be helpful to provide an edge-emitting semiconductor laser and a method of producing an edge-emitting semiconductor laser.

SUMMARY

We provide an edge-emitting semiconductor laser including a semiconductor structure having a waveguide layer with an embedded active layer, wherein the waveguide layer extends in a longitudinal direction between a first side facet and a second side facet of the semiconductor structure, the semiconductor structure has a tapering region adjacent to the first side facet, a thickness of the waveguide layer, measured perpendicularly to the longitudinal direction, in the tapering region increases along the longitudinal direction, the waveguide layer is arranged between a first cladding layer and a second cladding layer, a thickness of the second cladding layer, measured perpendicularly to the longitudinal direction, in the tapering region of the semiconductor structure increase in the longitudinal direction, the tapering region includes a first subregion and a second subregion, the first subregion is arranged closer to the first side facet than the second subregion, the thickness of the waveguide layer increases in the longitudinal direction in the first subregion, the thickness of the waveguide layer is constant in the longitudinal direction in the second subregion, and the thickness of the second cladding layer increase in the longitudinal direction in the second subregion.

We also provide a method of producing an edge-emitting semiconductor laser including producing a semiconductor structure having a waveguide layer with an embedded active layer, the waveguide layer extending in a longitudinal direction between a first side facet and a second side facet of the semiconductor structure, wherein the waveguide layer is arranged between a first cladding layer and a second cladding layer, and partially removing the waveguide layer and the second cladding layer in a tapering region, adjacent to the first side face, of the semiconductor structure such that a thickness, measured perpendicularly to the longitudinal direction, of the waveguide layer in the tapering region increases along the longitudinal direction and a thickness of the second cladding layer, measured perpendicularly to the longitudinal direction, in the tapering region of the semiconductor structure increases in the longitudinal direction, wherein the tapering region includes a first subregion and a second subregion, the first subregion is arranged closer to the first side facet than the second subregion, the thickness of the waveguide layer increases in the longitudinal direction in the first subregion, the thickness of the waveguide layer is constant in the longitudinal direction in the second subregion, and the thickness of the second cladding layer increases in the longitudinal direction in the second subregion.

We further provide an edge-emitting semiconductor laser including a semiconductor structure having a waveguide layer with an embedded active layer, wherein the waveguide layer extends in a longitudinal direction between a first side facet and a second side facet of the semiconductor structure, the semiconductor structure has a tapering region adjacent to the first side facet, and a thickness of the waveguide layer, measured perpendicularly to the longitudinal direction, in the tapering region increases along the longitudinal direction.

LIST OF REFERENCES 10 first semiconductor laser
20 second semiconductor laser
30 third semiconductor laser
40 fourth semiconductor laser
400 semiconductor structure
401 first side facet
402 upper side
403 longitudinal direction
404 growth direction
410 first waveguide sublayer
411 thickness of the first waveguide sublayer
420 second waveguide sublayer
421 thickness of the second waveguide sublayer
430 active layer
440 waveguide layer
441 thickness of the waveguide layer
450 first cladding layer
460 second cladding layer
461 thickness of the second cladding layer
470 passivation layer
480 electrical contact surface
490 etch stop layer
100 first tapering region
105 chamfer
110 first subregion
111 length
120 second subregion
130 first intensity profile
140 second intensity profile
200 second tapering region
205 chamfer
210 first subregion
211 length
220 second subregion
230 first intensity profile 240 second intensity profile
300 third tapering region
305 chamfer
310 first subregion
311 length
320 second subregion
330 first intensity profile
340 second intensity profile
350 step
500 fourth tapering region
505 chamfer
510 first subregion
511 length
520 second subregion
530 first intensity profile
540 second intensity profile
550 third subregion
551 length

DETAILED DESCRIPTION

Our edge-emitting semiconductor laser comprises a semiconductor structure having a waveguide layer with an embedded active layer. The waveguide layer may extend in a longitudinal direction between a first side facet and a second side facet of the semiconductor structure. The semiconductor structure furthermore has a tapering region adjacent to the first side facet thereof. A thickness of the waveguide layer, measured perpendicularly to the longitudinal direction, in the tapering region increases along the longitudinal direction.

The thickness of the waveguide layer decreasing in the direction of the first side facet of the semiconductor structure of this edge-emitting semiconductor laser leads to an overlap, decreasing in the direction of the first side facet, between a laser mode guided in the waveguide of the semiconductor structure and the active layer. In this way, absorption of laser radiation and concomitant charge separation advantageously occur only to a reduced extent close to the first side facet of the semiconductor structure so that the likelihood of nonradiative recombination processes at the first side facet is also reduced. This is associated with reduced heat generation at the first side facet. The likelihood of damage or destruction of the edge-emitting semiconductor laser by optically induced damage is therefore reduced. This advantageously makes it possible to increase the maximum output power of the edge-emitting semiconductor laser. Furthermore, an emission width of the active layer can be reduced so that a higher beam quality can be achieved and so that the edge-emitting semiconductor laser can be produced more economically. Because of the reduced number of nonradiative recombination processes at the first side facet of the semiconductor structure of the edge-emitting semiconductor laser, the requirements for passivation of the first side facet can furthermore be reduced. Furthermore, the semiconductor structure of the edge-emitting semiconductor laser can be configured with a high optical confinement factor so that low threshold current strengths can be achieved.

The thickness of the waveguide layer may increase linearly along the longitudinal direction. Advantageously, the semiconductor structure of the edge-emitting semiconductor laser can therefore be produced particularly straightforwardly. The linear increase in the thickness of the waveguide layer along the longitudinal direction makes it possible to configure a far field of laser radiation emitted by the edge-emitting semiconductor laser.

The thickness of the waveguide layer may increase more than linearly along the longitudinal direction. Advantageously, the tapering region may therefore be configured to be particularly short in the longitudinal direction. Furthermore, the increase in the thickness of the waveguide layer of the semiconductor structure along the longitudinal direction may make it possible to configure a far field of laser radiation emitted by the edge-emitting semiconductor laser.

The waveguide layer may comprise a first waveguide sublayer and a second waveguide sublayer. The active layer may be arranged between the first waveguide sublayer and the second waveguide sublayer. A thickness of the second waveguide sublayer in the tapering region of the semiconductor structure increases along the longitudinal direction. Advantageously, the thickness, decreasing in the direction of the first side facet of the second waveguide sublayer of the waveguide layer of the semiconductor structure of the edge-emitting semiconductor laser leads to an overlap, decreasing in the direction of the first side facet, between a laser mode that can be excited in the waveguide layer and the active layer of the waveguide layer of the semiconductor structure.

The thickness of the first waveguide sublayer in the tapering region of the semiconductor structure may be constant in the longitudinal direction. Advantageously, the tapering region of the semiconductor structure of the edge-emitting semiconductor laser can therefore be produced particularly straightforwardly and economically. The constant thickness of the first waveguide sublayer in the longitudinal direction furthermore advantageously allows an extent of a laser mode that can be excited in the waveguide layer in the longitudinal direction as far as the first side facet so that laser radiation can be output at the first side facet of the semiconductor structure of the edge-emitting semiconductor laser.

The waveguide layer may be arranged between a first cladding layer and a second cladding layer. The thickness of the second cladding layer, measured perpendicularly to the longitudinal direction in the tapering region of the semiconductor structure, may increase in the longitudinal direction. Advantageously, this allows particularly straightforward production of the tapering region of the semiconductor structure of the edge-emitting semiconductor laser. For example, the tapering region of the semiconductor structure may be applied by an etching process starting from an upper side of the semiconductor structure.

The tapering region may comprise a first subregion and a second subregion. The first subregion may be arranged closer to the first side facet than the second subregion. The thickness of the waveguide layer increases in the longitudinal direction in the first subregion. The thickness of the waveguide layer is constant in the longitudinal direction in the second subregion. Furthermore, the thickness of the second cladding layer increases in the longitudinal direction in the second subregion. Advantageously, this allows continuous tapering of the semiconductor structure of the edge-emitting semiconductor laser in the tapering region in the longitudinal direction to the first side facet. In this way, a waveform of a laser mode that can be excited in the waveguide layer of the semiconductor structure of the edge-emitting semiconductor laser may advantageously be deformed adiabatically, without a reflection of the laser radiation that can be excited in the waveguide layer taking place in the tapering region.

The tapering region may comprise a third subregion extending between the first side facet and the first subregion. The thickness of the waveguide layer may be constant in the longitudinal direction in the third subregion. Advantageously, the third subregion therefore forms a flat section of the tapering region adjacent to the first side facet. The third subregion of the tapering region advantageously simplifies production of the tapering region. In particular, required accuracies in exposure processes carried out to produce the tapering region, for example, required alignment accuracies are reduced by provision of the third subregion of the tapering region. The third subregion of the tapering region of the edge-emitting semiconductor laser furthermore also facilitates cleaving of the semiconductor structure of the edge-emitting semiconductor laser required to produce the edge-emitting semiconductor laser. Overall, production of the edge-emitting semiconductor laser is therefore simplified so that it can be obtained more economically.

The third subregion may have a length of 5 μm to 25 μm in the longitudinal direction. Advantageously, the third subregion of the tapering region therefore forms a sufficiently large tolerance range to compensate for possible irregularities, in particular alignment inaccuracies when carrying out an exposure process during production of the tapering region of the edge-emitting semiconductor laser. Furthermore, the third subregion of the tapering region therefore forms a sufficiently large planar starting point to cleave of the semiconductor structure of the edge-emitting semiconductor laser.

The first subregion may have a length of 10 μm to 160 μm in the longitudinal direction, preferably a length of 20 μm to 80 μm, particularly preferably a length of 30 μm to 60 μm. For example, the first subregion of the tapering region of the semiconductor structure of the edge-emitting semiconductor laser may have a length of 40 μm in the longitudinal direction. Advantageously, adiabatic deformation of a laser mode that can be excited in the waveguide layer of the semiconductor structure of the edge-emitting semiconductor laser then takes place without greatly reducing the length of the waveguide layer of the semiconductor structure that can be used to generate laser radiation.

The tapering region may be configured as a chamfer extending from an upper side of the semiconductor structure to the first side facet of the semiconductor structure. The chamfer may extend at least partially into the waveguide layer. Advantageously, the tapering region of the semiconductor structure of the edge-emitting semiconductor laser can therefore be straightforwardly and economically produced. For example, the tapering region of the edge-emitting semiconductor laser can be produced by an etching process. The continuous decrease in the thickness of the waveguide layer in a growth direction oriented perpendicularly to the longitudinal direction may advantageously lead to an adiabatic reduction of an overlap between a laser mode that can be excited in the waveguide layer and an active layer of the waveguide layer in the direction of the first side facet.

A step may be formed between the chamfer and the upper side of the semiconductor structure. The thickness measured perpendicularly to the longitudinal direction of a second cladding layer adjacent to the waveguide layer may increase at the step. Advantageously, the tapering region can therefore be configured to be particularly short in the longitudinal direction. This allows a particularly long configuration of a section which can be used to excite laser radiation of the waveguide layer of the semiconductor structure of the edge-emitting semiconductor laser in the longitudinal direction.

The waveguide layer may have an embedded etch stop layer. The etch stop layer may consist of material that can be detected in real time when carrying out an etching process. Preferably, there is furthermore a lower etching rate for the material of the etch stop layer when carrying out an etching process than for the material of the part of the waveguide layer surrounding the etch stop layer. For example, the etch stop layer may consist of GaInP. Advantageously, the etch stop layer may be used as a marker when carrying out an etching process to apply the tapering region of the semiconductor structure, which indicates that a desired etching depth has been reached. Advantageously, this allows straightforward and reproducible production of the edge-emitting semiconductor laser.

The semiconductor structure may have a second tapering region adjacent to the second side facet. The thickness measured perpendicularly to the longitudinal direction of the waveguide layer may increase along the longitudinal direction in the second tapering region. The thickness of the waveguide layer decreasing in the direction of the second side facet of the semiconductor structure of the edge-emitting semiconductor laser leads to an overlap, decreasing in the direction of the second side facet, between a laser mode guided in the waveguide of the semiconductor structure and the active layer. In this way, absorption of laser radiation and concomitant generation of charge carriers advantageously occur only to a reduced extent close to the second side facet of the semiconductor structure so that the likelihood of nonradiative recombination processes at the second side facet is also reduced. The likelihood of damage or destruction of the edge-emitting semiconductor laser by optically induced damage is therefore reduced. Another advantage of the second tapering region provided at the second side facet of the edge-emitting semiconductor laser is that it can be produced together with the tapering region formed at the first side facet of the edge-emitting semiconductor laser so that production of the edge-emitting semiconductor laser is simplified overall.

Our method of producing an edge-emitting semiconductor laser comprises steps of producing a semiconductor structure having a waveguide layer with an embedded active layer, the waveguide layer extending in a longitudinal direction between a first side facet and a second side facet of the semiconductor structure, and partially removing the waveguide layer in a tapering region, adjacent to the first side facet, of the semiconductor structure such that the thickness measured perpendicularly to the longitudinal direction of the waveguide layer in the tapering region increases along the longitudinal direction. In the edge-emitting semiconductor laser which can be obtained by this method, an overlap of a laser mode that can be excited in the waveguide layer of the semiconductor structure of the edge-emitting semiconductor laser and the active layer of the waveguide layer of the semiconductor structure decreases in the direction of the first side facet of the semiconductor structure. Absorption of laser radiation and charge separation therefore occur only to a reduced extent close to the first side facet of the semiconductor structure in the region of the active layer. Therefore, nonradiative recombination processes and heat generation caused thereby also occur only to a reduced extent in the region of the active layer at the first side facet. In the edge-emitting semiconductor laser which can be obtained by the method, there is therefore only a small risk of optically induced damage in the region of the active layer at the first side facet of the semiconductor structure.

Removal of the waveguide layer may be carried out by an etching process. Advantageously, the method can therefore be carried out particularly straightforwardly and economically.

A second cladding layer adjacent to the waveguide layer may be uniformly removed throughout the tapering region in a first etching process. Subsequently, the waveguide layer is partially removed in a subsequent second etching process. Advantageously, the method therefore makes it possible to configure the tapering region of the semiconductor structure of the edge-emitting semiconductor laser to be short in the longitudinal direction, a reduction of an overlap between a laser mode that can be excited in the waveguide layer of the semiconductor structure and the active layer of the waveguide layer of the semiconductor structure in the longitudinal direction nevertheless being carried out adiabatically. The short length of the tapering region of the semiconductor structure of the edge-emitting semiconductor laser which can be obtained by the method makes it possible to configure a part, which can be used to excite laser radiation, of the waveguide layer of the semiconductor structure of the edge-emitting semiconductor laser with a large length.

The above-described properties, features and advantages, as well as the way in which they are achieved, will become more clearly and comprehensively understandable in connection with the following description of the examples, which will be explained in more detail in connection with the drawings.

Figure 1:
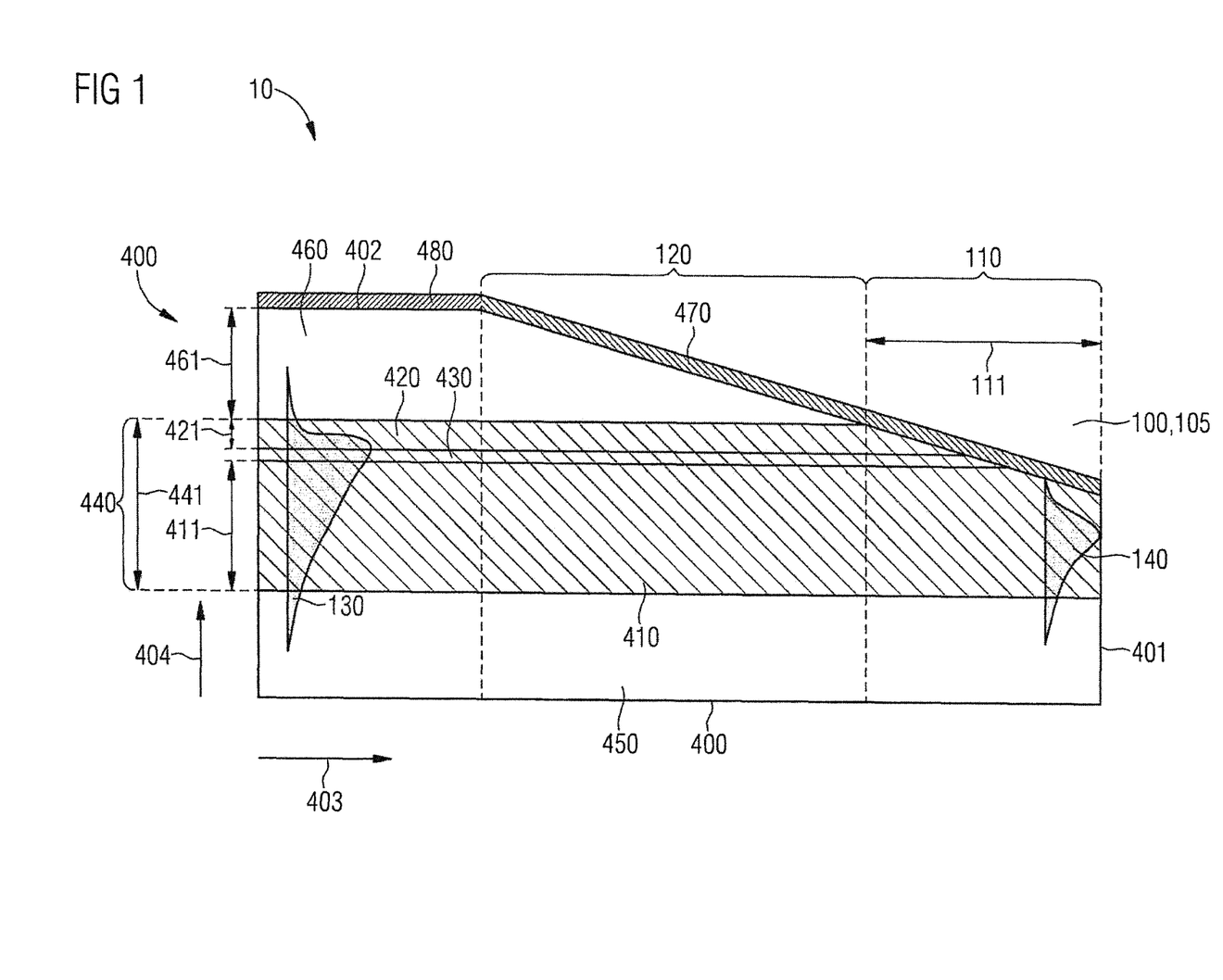
FIG. 1 shows a section through a semiconductor structure of a first semiconductor laser.

FIG. 1 shows a schematic sectional representation of a part of a first semiconductor laser 10. The first semiconductor laser 10 is an edge-emitting semiconductor laser.

The first semiconductor laser 10 has a semiconductor structure 400. The semiconductor structure 400 is configured as a layer structure having layers of different semiconductor materials arranged successively in a growth direction 404. The semiconductor structure 400 may, for example, be produced by epitaxial growth. FIG. 1 shows a section, parallel to the growth direction 404, through a part of the semiconductor structure 400.

The semiconductor structure 400 has a waveguide layer 440. The waveguide layer 440 extends in a longitudinal direction 403 oriented perpendicularly to the growth direction 404, between a first side facet 401 of the semiconductor structure 400 and a second side facet, lying opposite the first side facet 401 of the semiconductor structure 400. The second side facet of the semiconductor structure 400 cannot be seen in the detail of the semiconductor structure 400 represented in FIG. 1. In the context of this description, longitudinal direction 403 refers to the orientation of the longitudinal axis of the waveguide layer 440, without a particular sign of this axis thereby being implied. Therefore, both the direction of the corresponding arrow of FIG. 1 and the opposite direction may be referred to as longitudinal direction 403.

The waveguide layer 440 of the semiconductor structure 400 is arranged between a first cladding layer 450 and a second cladding layer 460 of the semiconductor structure 400. The first cladding layer 450 and the second cladding layer 460 respectively extend perpendicularly to the growth direction 404. The second cladding layer 460 forms an upper side 402 of the semiconductor structure 400. The first cladding layer 450 and the second cladding layer 460 may consist of a different material than the waveguide layer 440. In particular, the first cladding layer 450 and the second cladding layer 460 of the semiconductor structure 400 may have a different refractive index than the waveguide layer 440. At the boundary between the waveguide layer 440 and the first cladding layer 450, as well as at the boundary between the waveguide layer 440 and the second cladding layer 460, a change in the refractive index then respectively takes place.

The waveguide layer 440 comprises, successively in the growth direction 404, a first waveguide sublayer 410, an active layer 430 and a second waveguide sublayer 420. The first waveguide sublayer 410 is adjacent to the first cladding layer 450, and is therefore arranged between the first cladding layer 450 and the active layer 430. The second waveguide sublayer 420 is adjacent to the second cladding layer 460, and is therefore arranged between the active layer 430 and the second cladding layer 460.

The active layer 430 may consist of a different material than the first waveguide sublayer 410 and the second waveguide sublayer 420. The active layer 430 may, for example, be configured as a two-dimensional quantum well or as a multiplicity of successive two-dimensional quantum wells (multiple quantum well) in the growth direction 404. The active layer 430 may also have quantum dots configured as an active volume (bulk) or in another way.

An electrical contact surface 480 is arranged on the upper side 402 of the semiconductor structure 400 of the first semiconductor laser 100. A further electrical contact surface (not represented in FIG. 1) is arranged on a lower side, lying opposite the upper side 402, of the semiconductor structure 400. Via the electrical contact surface 480 and the further electrical contact surface, a direct electric current can be conducted along the growth direction 404 through the semiconductor structure 400. Radiative recombination of positive and negative charge carriers may take place in the active layer 430 which causes emission of light.

Dielectric mirrors (not represented in FIG. 1) are respectively arranged on the first side facet 401 of the semiconductor structure 400 and on the second side facet, lying opposite the first side facet 401 of the semiconductor structure 400. The dielectric mirrors limit propagation in the longitudinal direction 403 of light emitted in the active layer 430 of the waveguide layer 440. In the growth direction 404, light emitted in the active layer 430 of the waveguide layer 440 is limited by the changes in the refractive index at the boundaries between the waveguide layer 440 and the cladding layers 450, 460. Propagation of light generated in the active layer 430 is also spatially limited in the direction perpendicular to the longitudinal direction 403 and the growth direction 404, for example, by lateral structuring of the second cladding layer 460. The waveguide layer 440 of the semiconductor structure 400 therefore forms an optical resonator in which a standing light wave can be formed.

The standing light wave excited in the optical resonator formed by the waveguide layer 440 may lead to stimulated emission of further light by recombination of further charge carriers in the active layer 430. At the same time, a population conversion in the active layer 430 may be sustained by a direct current, acting as a pump current, between the electrical contact surface 480 and the further electrical contact surface of the semiconductor structure 400. A laser mode is then excited in the waveguide layer 440.

The first side facet 401 may be a laser facet of the semiconductor structure 400. The mirror arranged on the first side facet 401 of the semiconductor structure 400 is then configured to be partially transparent so that laser light excited in the waveguide layer 440 of the semiconductor structure 400 can emerge as a laser beam at the first side facet 401 of the semiconductor structure 400. The first side facet 401 may, however, also be the side facet lying opposite the laser facet of the semiconductor structure 400. The second side facet lying opposite the first side facet 401 may thus form the laser facet of the semiconductor structure 400. The first side facet 401 and the second side facet may also both have identical or similar reflection coefficients.

The semiconductor structure 400 of the first semiconductor laser 10 has a first tapering region 100 adjacent to the first side facet 401. The first tapering region 100 is configured as a chamfer or bevel 105, which extends obliquely from the upper side 402 of the semiconductor structure 400 to the first side facet 401 of the semiconductor structure 400 of the first semiconductor laser 10. A part of the second cladding layer 460 and a part of the waveguide layer 440 may be removed in the first tapering region 100.

The first tapering region 100 comprises a first subregion 110 and a second subregion 120. The first subregion 110 and the second subregion 120 are successively arranged in the longitudinal direction 403 of the semiconductor structure 400. The first subregion 110 of the first tapering region 100 may be adjacent to the first side facet 401 of the semiconductor structure 400.

The first waveguide sublayer 410 of the waveguide layer 440 of the semiconductor structure 400 of the first semiconductor laser 10 has a thickness 411 in the growth direction 404. The second waveguide sublayer 420 of the waveguide layer 440 of the semiconductor structure 400 has a thickness 421 in the growth direction 404. Overall, the waveguide layer 440 of the semiconductor structure 400 of the first semiconductor laser 10 has a thickness 441 in the growth direction 404. The second cladding layer 460 of the semiconductor structure 400 has a thickness 461 in the growth direction 404.

The thickness 441 of the waveguide layer 440 of the semiconductor structure 400 of the first semiconductor laser 10 increases in the first tapering region 100 starting from the first side facet 401 along the longitudinal direction 403. At the first side facet 401 of the semiconductor structure 400, the thickness 441 of the waveguide layer 440 is less than at the boundary between the first subregion 110 and the second subregion 120 of the first tapering region 100. At the boundary between the first subregion 110 and the second subregion 120 of the first tapering region 100, the waveguide layer 440 reaches its maximum thickness 441. In the second subregion 120 of the first tapering region 100, the thickness 441 of the waveguide layer 440 does not increase further along the longitudinal direction 403. In the first subregion 110 of the first tapering region 100, the thickness 441 of the waveguide layer 440 increases approximately linearly.

The second cladding layer 460 of the semiconductor structure 400 of the first semiconductor laser 10 is fully removed in the first subregion 110 of the first tapering region 100. In the second subregion 120 of the first tapering region 100, the thickness 461 of the second cladding layer 460 increases along the longitudinal direction 403. The thickness 461 of the second cladding layer 460 may increase approximately linearly. At the boundary between the first tapering region 100 of the semiconductor structure 400 of the first semiconductor laser 10 and the other sections of the semiconductor structure 400, the second cladding layer 461 has its maximum thickness 461.

In the illustrated example, the first tapering region 100 in the first subregion 110 extends into the first waveguide sublayer 410 of the waveguide layer 440. The thickness 411 of the first waveguide sublayer 410 of the waveguide layer 440 of the semiconductor structure 400 therefore also increases in the first subregion 110 of the first tapering region 100 starting from the first side facet 401 along the longitudinal direction 403. The active layer 430 of the waveguide layer 440 is partially removed in the first subregion 110 of the first tapering region 100. It is, however, also possible to configure the first tapering region 100 such that it extends only into the second waveguide sublayer 420 of the waveguide layer 440.

FIG. 1 shows in a purely schematic representation a first intensity profile 130 and a second intensity profile 140 of a laser mode that can be excited in the waveguide layer 440 of the semiconductor structure 400 of the first semiconductor laser 10. The two intensity profiles 130, 140 represent an intensity variation of the laser mode in the region of the waveguide layer 440 and the adjacent cladding layers 450, 460 in the growth direction 404. The first intensity profile 130 may show the intensity variation in a part of the semiconductor structure 400 of the first semiconductor laser 10 lying outside the first tapering region 100. The second intensity profile 140 illustrates the intensity variation in the tapering region 100 close to the first side facet 401. The first intensity profile 130 shows that the laser mode that can be excited in the waveguide layer 440 of the semiconductor structure 400 of the first semiconductor laser 10 has a large overlap with the active layer 430 of the waveguide layer 440 in the part of the semiconductor structure 400 arranged outside the first tapering region 100. The second intensity profile 140, on the other hand, shows that the laser mode that can be excited in the waveguide layer 440 has only a very small or even vanishing overlap with the active layer 430 of the semiconductor structure 400 in the first tapering region 100 of the semiconductor structure 400 close to the first side facet 401 of the semiconductor structure 400.

Because of the small overlap between the laser mode that can be excited in the waveguide layer 440 of the semiconductor structure 400 of the first semiconductor laser 10 and the active layer 430 of the semiconductor structure 400 in the region close to the first side facet 401 of the semiconductor structure 400, absorption of the laser radiation that can be excited in the waveguide layer 440 takes place only to a small extent close to the first side facet 401. Therefore, nonradiative recombination, for example, nonradiative recombination at the surface defects of the first side facet 401, and concomitant heat generation, can also take place only to a small extent in the region of the first side facet 401. In this way, the risk of the occurrence of optically induced damage (catastrophic optical damage; COD) in the region of the first side facet 401 of the semiconductor structure 400 is advantageously low. This makes it possible to operate the first semiconductor laser 10 with a high output power.

The chamfer or bevel 105 formed in the first tapering region 100 of the semiconductor structure 400 of the first semiconductor laser 10 associated in the longitudinal direction 403 to the first side facet 401 with a decrease in the thickness 441 of the waveguide layer 440, leads to deformation of the laser mode that can be excited in the waveguide layer 440 of the semiconductor structure 400, as is schematically indicated by the first intensity profile 130 and the second intensity profile 140. The change in the thickness 441 of the waveguide layer 440 in the first tapering region 100 of the semiconductor structure 400 of the first semiconductor laser 10 may take place so gradually in the longitudinal direction 403 that deformation of the laser mode takes place adiabatically without the light radiation excited in the waveguide layer 440 already being reflected before reaching the first side facet 401.

In a part of the semiconductor structure 400 of the first semiconductor laser 10 arranged outside the first tapering region 100, the waveguide layer 400 and the cladding layers 450, 460 may be configured such that there is a large overlap between the laser mode that can be excited in the waveguide layer 440 and the active layer 430 of the semiconductor structure 400. In this way, a low laser threshold (low threshold current) can be achieved in the parts of the semiconductor structure 400 of the first semiconductor laser 10 arranged outside the first tapering region 100.

The first subregion 110 of the first tapering region 100 of the semiconductor structure 400 of the first semiconductor laser 10 has a length 111 in the longitudinal direction 403. The length 111 is dimensioned to be so large that deformation of the laser mode that can be excited in the waveguide layer 440 takes place adiabatically. At the same time, however, the length 111 of the first subregion 110 of the first tapering region 100 and the length of the entire first tapering region 100 in the longitudinal direction 403 should be selected to be as small as possible to keep the length of the waveguide layer 440 of the semiconductor structure 400 as large as possible in the longitudinal direction 403 which can be used to excite laser radiation. Preferably, the length 111 of the first subregion 110 is 10 μm to 160 μm. Particularly preferably, the length 111 of the first subregion 110 of the first tapering region 100 is 20 μm to 80 μm. More particularly preferably, the length 111 of the first subregion 110 of the first tapering region 100 is 30 μm to 60 μm. For example, the first subregion 110 of the first tapering region 100 of the semiconductor structure 400 of the first semiconductor laser 10 may have a length 111 of 40 μm in the growth direction 404.

The first tapering region 100 of the semiconductor structure 400 of the first semiconductor laser 10 may be applied by various methods evident to those skilled in the art. For example, the first tapering region 100 of the semiconductor structure 400 of the first semiconductor laser 10 may be applied by an etching process after production of the semiconductor structure 400. For example, a partially transparent etching mask with a variable transparency in the longitudinal direction 403 may be used. By the etching process, the electrical contact surface 480, a part of the second cladding layer 460 and a part of the waveguide layer 440 are removed in the first tapering region 100. Preferably, a passivation layer 470 is also applied on the upper side of the first tapering region 100 after application of the first tapering region 100.

The first tapering region 100 of the semiconductor structure 400 of the first semiconductor laser 10 may additionally be used to modify a far field of a laser beam emitted by the first semiconductor laser 10. This advantageously leads to additional freedom in the configuration of the waveguide layer 440 in the parts of the semiconductor structure 400 of the first semiconductor laser 10 arranged outside the first tapering region 100.

Figure 2:
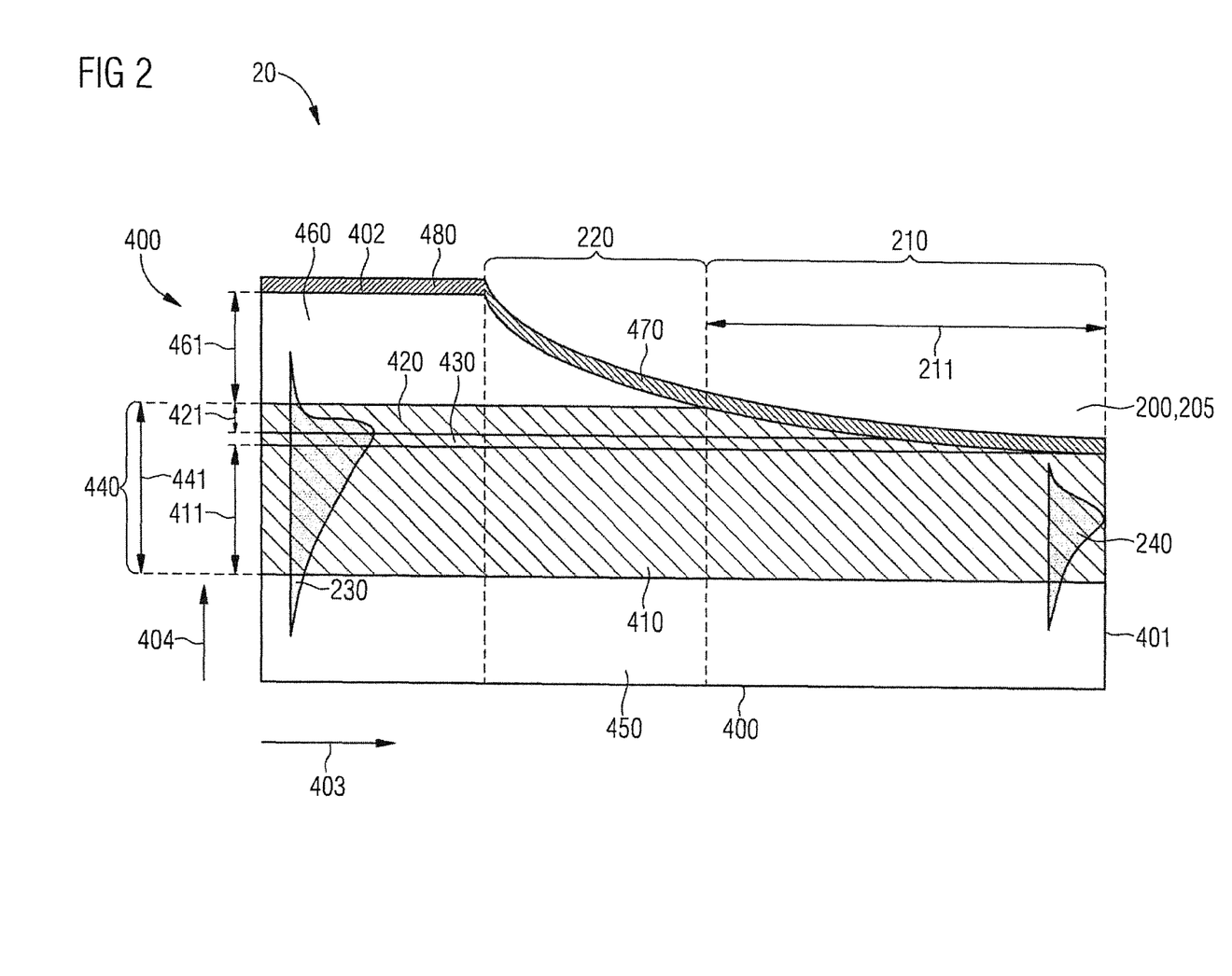
FIG. 2 shows a section through a semiconductor structure of a second semiconductor laser.

FIG. 2 shows a schematic sectional representation of a part of a second semiconductor laser 20. The second semiconductor laser 20 has large correspondences with the first semiconductor laser 10. In particular, the second semiconductor laser 20 has a semiconductor structure 400 whose construction corresponds to the semiconductor structure 400 of the first semiconductor laser 10 of FIG. 1. Components of the second semiconductor laser 20 corresponding to components present in the first semiconductor laser 10 are provided with the same references in FIG. 2 as in FIG. 1 and will not be described again in detail below.

Instead of the first tapering region 100, the semiconductor structure 400 of the second semiconductor laser 20 has a second tapering region 200. The second tapering region 200 is configured as a chamfer or bevel 205 extending from the upper side 402 to the first side facet 401 of the semiconductor structure 400 through the second cladding layer 460 of the semiconductor structure 400 and a part of the waveguide layer 440 of the semiconductor structure 400.

The second tapering region 200 has a first subregion 210 and a second subregion 220 successively arranged successively in the longitudinal direction 403. The first subregion 210 is adjacent to the first side facet 401 and has a length 211 in the longitudinal direction 403. The length 211 of the first subregion 210 of the second tapering region 200 may correspond to the length 111 of the first subregion 110 of the first tapering region 100 of the semiconductor structure 400 of the first semiconductor laser 10.

The thickness 441 of the waveguide layer 440 of the semiconductor structure 400 of the second semiconductor laser 20 increases in the second tapering region 200 starting from the first side facet 401 along the longitudinal direction 403. The thickness 441 of the waveguide layer 440 may increase more than linearly along the longitudinal direction 403. The thickness 461 of the second cladding layer 460 of the semiconductor structure 400 of the second semiconductor laser 20 also increases more than linearly in the second tapering region 200, starting from the first side facet 401 along the longitudinal direction 403. The thickness 441 of the waveguide layer 440 in this case increases only in the first subregion 210 of the second tapering region 200, and has its constant maximum thickness 441 in the second subregion 220 of the second tapering region 200. The second cladding layer 460 is fully removed in the first subregion 210 of the second tapering region 200. The thickness 461 of the second cladding layer 460 therefore increases only in the second subregion 220 of the second tapering region 200.

In the semiconductor structure 400 of the second semiconductor laser 20, the second tapering region 200 extends only into the second waveguide sublayer 420 and the active layer 430 of the waveguide layer 440. The first waveguide sublayer 410 of the waveguide layer 440 of the semiconductor structure 400 of the second semiconductor laser 20 has a constant thickness 411 throughout the second tapering region 200. It is, however, also possible to configure the second tapering region 200 such that in the first subregion 210 it extends into the first waveguide sublayer 410 of the waveguide layer 440.

FIG. 2 shows two highly schematized intensity profiles 230, 240 representing an intensity variation in the growth direction 404 of a laser mode that can be excited in the waveguide layer 440 of the semiconductor structure 400 of the second semiconductor laser 20. The first intensity profile 230 indicates the intensity variation of the laser mode that can be excited in the waveguide layer 440 at a position of the semiconductor structure 400 of the second semiconductor laser 20 lying outside the second tapering region 200. The second intensity profile 240 represents the intensity variation in the growth direction 404 close to the first side facet 401 of the semiconductor structure 400 of the second semiconductor laser 20.

From a comparison of the first intensity profile 230 to the second intensity profile 240, it can be seen that the laser mode that can be excited in the waveguide layer 440 of the semiconductor structure 400 of the second semiconductor laser 20 is modified by the second tapering region 200 in the longitudinal direction 403 toward the first side facet 401 such that the overlap between the laser mode that can be excited in the waveguide layer 440 and the active layer 430 of the semiconductor structure 400 decreases toward the first side facet 401. The effect of this is that laser radiation excited close to the first side facet 401 of the semiconductor structure 400 of the second semiconductor laser 20 in the waveguide layer 440 is absorbed only to a small extent. In the region of the first side facet 401 of the semiconductor structure 400 of the second semiconductor laser 20, therefore, nonradiative recombination and concomitant heating occur only to a small extent. In the second semiconductor laser 20, there is therefore only a small risk of optically induced damage. This makes it possible to operate the second semiconductor laser 20 with a high output optical power.

Production of the second semiconductor laser 20 may be carried out according to the same method as production of the first semiconductor laser 10. In particular, the second tapering region 200 may be applied in the same way as the first tapering region 100 of the first semiconductor laser 10 of FIG. 1.

Figure 3:
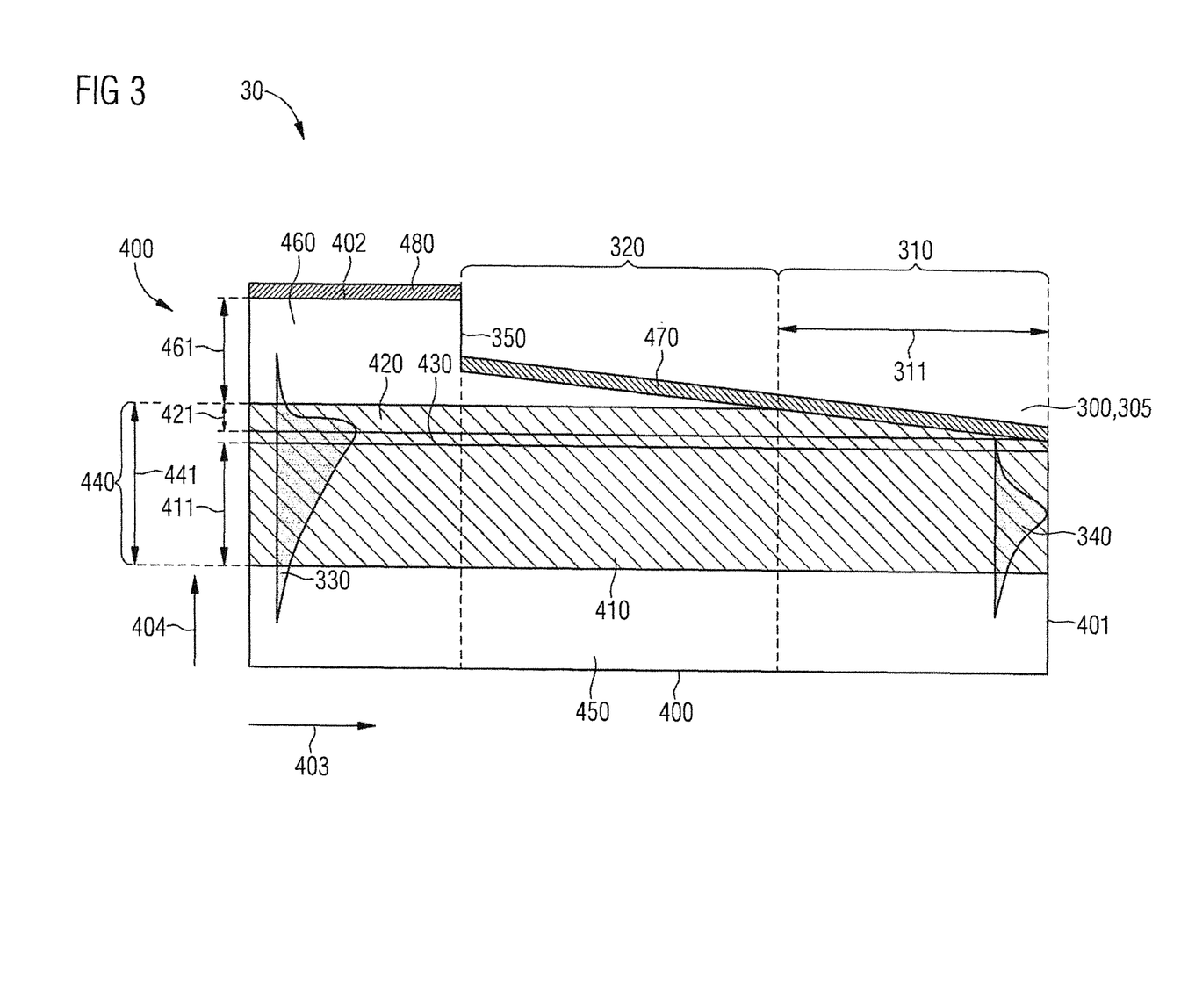
FIG. 3 shows a section through a semiconductor structure of a third semiconductor laser.

FIG. 3 shows a schematic sectional representation of a part of a third semiconductor laser 30. The third semiconductor laser 30 has large correspondences with the first semiconductor laser 10 of FIG. 1. Components of the third semiconductor laser 30 also present in the first semiconductor laser 10 of FIG. 1 are provided with the same references in FIG. 3 as in FIG. 1. Only those parts of the third semiconductor laser 30 in which it differs from the first semiconductor laser 10 will be explained below.

Instead of the first tapering region 100, the semiconductor structure 400 of the third semiconductor laser 30 has a third tapering region 300. The third tapering region 300 forms a chamfer or bevel 305 extending from the upper side 402 of the semiconductor structure 400 obliquely to the first side facet 401 of the semiconductor structure 400 of the third semiconductor laser 30. In addition, the semiconductor structure 400 of the third semiconductor laser 30 has a step 350 at the transition between the third tapering region 300 and the other sections of the semiconductor structure 400. At the step 350, the thickness 461 of the second cladding layer 460 changes abruptly.

The third tapering region 300 comprises a first subregion 310 and a second subregion 320 arranged successively in the longitudinal direction 403. The first subregion 310 may be adjacent to the first side facet 401 of the semiconductor structure 400. The first subregion 310 has a length 311 which may correspond to the length 111 of the first subregion 110 of the first tapering region 100 of the first semiconductor laser 10.

The thickness 441 of the waveguide layer 440 of the semiconductor structure 400 of the third semiconductor laser 30 increases linearly in the first subregion 310 of the third tapering region 300 starting from the first side facet 401 of the semiconductor structure 400 along the longitudinal direction 403. In the second subregion 320 of the third tapering region 300, the waveguide layer 440 has the same maximum thickness 441 as in the parts of the semiconductor structure 400 outside the third tapering region 300. The third tapering region 300 extends in the first subregion 310 only into the second waveguide sublayer 420 of the waveguide layer 440. The third tapering region 300 can, however, also be configured such that the active layer 430 and possibly the first waveguide sublayer 410 of the waveguide layer 400 are also partially removed in the first subregion 310 of the third tapering region 300.

The thickness 461 of the second cladding layer 460 of the semiconductor structure 400 of the third semiconductor laser 30 increases linearly in the second subregion 320 of the third tapering region 300 starting from the first subregion 310 of the third tapering region 300 along the longitudinal direction 403. In the first subregion 310 of the third tapering region 300, the second cladding layer 460 is completely removed. The thickness 461 of the second cladding layer 460 increases in the second subregion 320 of the third tapering region 300 as far as the step 350. At the step 350, the thickness 461 of the second cladding layer 460 abruptly increases.

It is also possible to configure the third tapering region 300 of the semiconductor structure 400 of the third semiconductor laser 30 such that the thickness 441 of the waveguide layer 440 and the thickness 461 of the second cladding layer 460 increase more than linearly in the third tapering region 300 along the longitudinal direction 403, as with the second tapering region 200 of the second semiconductor laser 20 of FIG. 2.

FIG. 3 shows highly schematic representations of a first intensity profile 330 and a second intensity profile 340 illustrating an intensity variation in the growth direction 404 of a laser mode that can be excited in the waveguide layer 440 of the semiconductor structure 400 of the third semiconductor laser 30. The first intensity profile 330 indicates the intensity variation in a part of the semiconductor structure 400 of the third semiconductor laser 30 outside the third tapering region 300. The second intensity profile 340 shows the intensity variation close to the first side facet 401 of the semiconductor structure 400 of the third semiconductor laser 30.

From the intensity profiles 330, 340, it can be seen that the third tapering region 300 of the semiconductor structure 400 of the third semiconductor laser 30 modifies a laser mode that can be excited in the waveguide layer 440 of the semiconductor structure 400 of the third semiconductor laser 30 in the longitudinal direction 403 toward the first side facet 401 to an extent such that an overlap between the laser mode that can be excited in the waveguide layer 440 and the active layer 430 of the semiconductor structure 400 decreases toward the first side facet 401. The effect of this is that laser radiation excited close to the first side facet 401 of the semiconductor structure 400 of the third semiconductor laser 30 in the waveguide layer 440 is absorbed only to a small extent. In the region of the first side facet 401 of the semiconductor structure 400 of the third semiconductor laser 30, therefore, nonradiative recombination and concomitant heating occur only to a small extent. In the third semiconductor laser 30, there is therefore only a small risk of optically induced damage. This makes it possible to operate the third semiconductor laser 30 with a high output optical power.

The third tapering region 300 of the semiconductor structure 400 of the third semiconductor laser 30 may be applied after production of the semiconductor structure 400 in a two-stage process. In this case, in a first process step, a part of the second cladding layer 460 of the semiconductor structure 400 (and the electrical contact surface 480) may be removed uniformly as far as the depth of the step 350 in the entire third tapering region 300. This may, for example, be done by an etching process. In a subsequent second process step, the chamfer or bevel 305 of the third tapering region 300 is applied. This may be done as explained with reference to the first tapering region 100 of the first semiconductor laser 10.

The step 350 formed in the third tapering region 300 of the third semiconductor laser 30 has the advantage that the second subregion 320 of the third tapering region 300 of the third semiconductor laser 30 can be configured to be shorter in the longitudinal direction 403 than the second subregion 120 of the first tapering region 100 of the first semiconductor laser 10. In the third semiconductor laser 30, therefore, a longer part of the waveguide layer 440 of the semiconductor structure 400, which can be used to excite a laser mode in the waveguide layer 440 of the semiconductor structure 400, therefore remains in the longitudinal direction 403.

Figure 4:
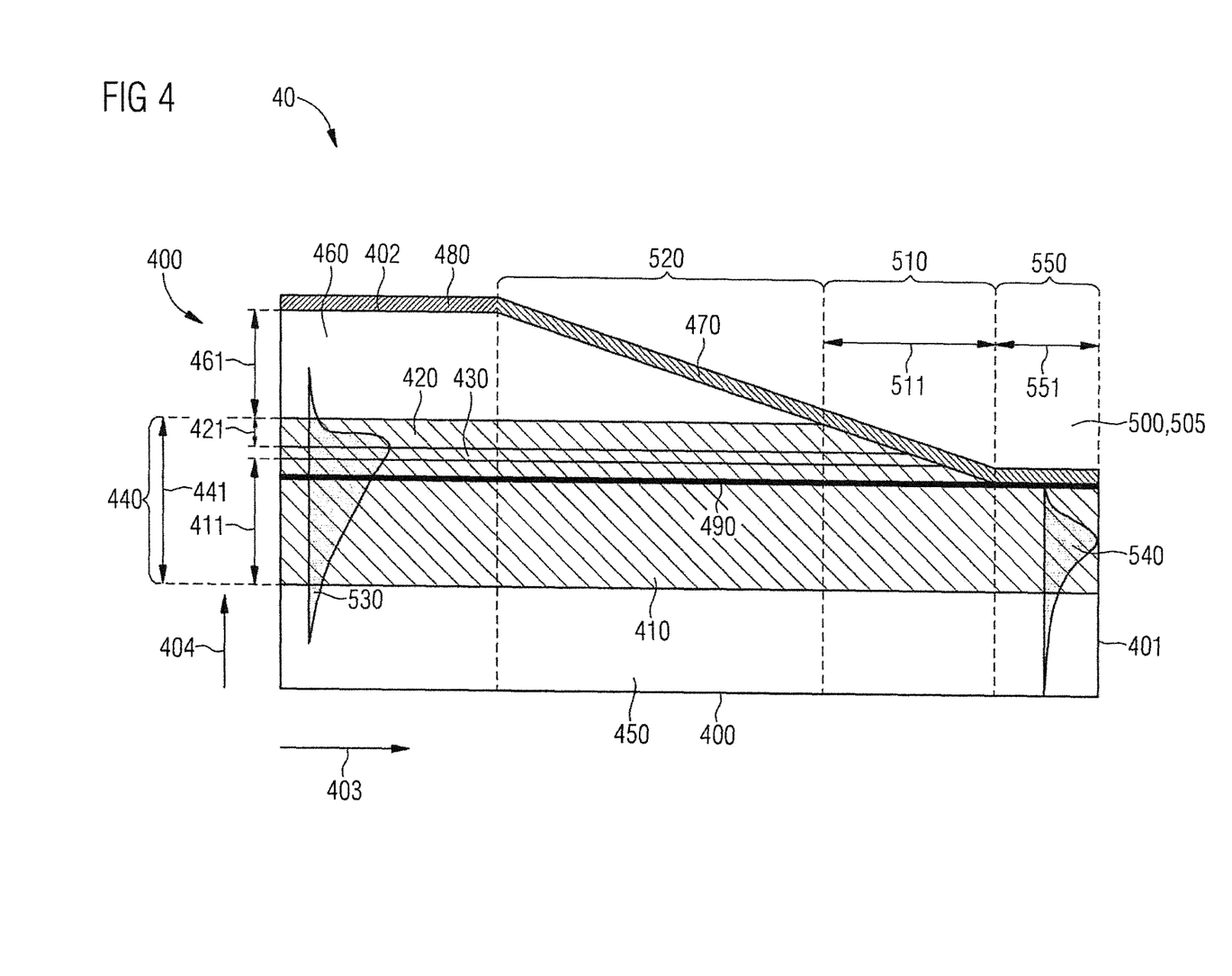
FIG. 4 shows a section through a semiconductor structure of a fourth semiconductor laser.

FIG. 4 shows a schematic sectional representation of a part of a fourth semiconductor laser 40. The fourth semiconductor laser 40 has large correspondences with the first semiconductor laser 10 of FIG. 1. Components of the fourth semiconductor laser 40 which are also present in the first semiconductor laser 10 of FIG. 1 are provided with the same references in FIG. 4 as in FIG. 1. Only those parts of the fourth semiconductor laser 40 in which it differs from the first semiconductor laser 10 will be explained below.

Instead of the first tapering region 100, the semiconductor structure 400 of the fourth semiconductor laser 40 has a fourth tapering region 500. The fourth tapering region 500 forms a chamfer or bevel 505 extending from the upper side 402 of the semiconductor structure 400 to the first side facet 401 of the semiconductor structure 400 through the second cladding layer 460 of the semiconductor structure 400 and a part of the waveguide layer 440 of the semiconductor structure 400.

The fourth tapering region 500 has a first subregion 510, a second subregion 520 and a third subregion 550 arranged successively in the longitudinal direction 403. The third subregion 550 may be adjacent to the first side facet 401. The first subregion 510 follows on from the third subregion 550. The second subregion 520 follows on from the first subregion 510. The first subregion 510 is therefore arranged between the third subregion 550 and the second subregion 520.

The first subregion 510 has a length 511 in the longitudinal direction 403. The length 511 of the first subregion 510 of the fourth tapering region 500 of the fourth semiconductor laser 40 may correspond to the length 111 of the first subregion 110 of the first tapering region 100 of the semiconductor structure 400 of the first semiconductor laser 10. The third subregion 550 has a length 551 in the longitudinal direction 403. The length 551 may, for example, be 5 µm to 25 µm.

The thickness 441 of the waveguide layer 440 of the semiconductor structure 400 of the fourth semiconductor laser 40 increases in the fourth tapering region 500 along the longitudinal direction away from the first side facet 401. However, the thickness 441 of the waveguide layer 440 in the third subregion 550 of the fourth tapering region 500 may be initially constant. Not until the first subregion 510 of the fourth tapering region 500 of the semiconductor structure 400 of the fourth semiconductor laser 40 does the thickness 441 of the waveguide layer 440 increase linearly along the longitudinal direction 403. The third subregion 550 and the first subregion 510 of the fourth tapering region 500 may merge continuously into one another. In the second subregion 520 of the fourth tapering region 500, the thickness 461 of the second cladding layer 460 of the semiconductor structure 400 of the fourth semiconductor laser 40 also linearly increases in the longitudinal direction 403 away from the first side facet 401. The thickness 441 of the waveguide layer 440 has its constant maximum thickness 441 in the second subregion 520 of the fourth tapering region 500. In the first subregion 510 of the fourth tapering region 500, the second cladding layer 460 is fully removed. The first subregion 510 and the second subregion 520 of the fourth tapering region 500 of the fourth semiconductor laser 40 therefore correspond in their configuration to the first subregion 110 and the second subregion 120 of the first tapering region 100 of the first semiconductor laser 10 of FIG. 1.

In the fourth semiconductor laser 40, the first subregion 510 of the fourth tapering region 500, as in the first semiconductor laser 10, extends into the first waveguide sublayer 410 of the waveguide layer 440 of the semiconductor structure 400. The thickness 411 of the first waveguide sublayer 410 of the waveguide layer 440 of the semiconductor structure 400 therefore also increases along the longitudinal direction 403 in the first subregion 510 of the fourth tapering region 500. The active layer 430 of the waveguide layer 440 is partially removed in the first subregion 510 of the fourth tapering region 500. It would, however, also be possible for the fourth tapering region 500 to extend only into the second waveguide sublayer 420 of the waveguide layer 440 in the first subregion 510, as is the case with the third semiconductor laser 30 of FIG. 3.

In the third subregion 550 of the fourth tapering region 500 of the fourth semiconductor laser 40, the second cladding layer 460, the second waveguide sublayer 420 and the active layer 430 are fully removed. A part of the first waveguide sublayer 410 of the waveguide layer 440 is also removed in the third subregion 550 of the fourth tapering region 500. If the fourth tapering region 500 is configured such that the first subregion 510 of the fourth tapering region 500 extends only into the second waveguide sublayer 420 of the waveguide layer 440, however, then only a part of the second waveguide sublayer 420 is also removed in the third subregion 550, while the active layer 430 and the second waveguide sublayer 420 of the waveguide layer 440 are still fully present.

The third subregion 550 of the fourth tapering region 500 may be applied in a separate process step, which precedes a process step of applying the first subregion 510 and the second subregion 520 of the fourth tapering region 500. The third subregion 550 may, however, also be simultaneously applied with the first subregion 510 and the second subregion 520 of the fourth tapering region 500. Application of the fourth tapering region 500 may, for example, be carried out by an etching process.

The waveguide layer 440 may have an embedded etch stop layer 490 specifying a desired maximum etching depth in the third subregion 550 of the fourth tapering region 500. In the example of the fourth semiconductor laser 40 as represented in FIG. 4, the etch stop layer 490 is embedded in the first waveguide sublayer 410 of the waveguide layer 440.

The etch stop layer 490 may consist of a material different from a material of a part of the waveguide layer 440 surrounding the etch stop layer 490. Preferably, the etch stop layer 490 consists of a material that can be detected in real time during the etching process. Particularly preferably, the etch stop layer 490 furthermore consists of a material for which there is a lower etching rate during the etching process than for the material surrounding the etch stop layer 490 of the waveguide layer 440. The etch stop layer 490 may, for example, consist of GaInP. While the etching process of applying the third subregion 550 of the fourth tapering region 500 is being carried out, the etching operation is then continued until the material of the etch stop layer 490 is detected. Detection of the material of the etch stop layer 490 indicates that the desired etching depth is reached and the etching operation can be ended.

The third subregion 550 of the fourth tapering region 500 of the fourth semiconductor laser 40 may facilitate cleaving the semiconductor structure 400 of the fourth semiconductor laser 40 along the first side facet 401 during production of the fourth semiconductor laser 40. Furthermore, by virtue of providing the third subregion 550 of the fourth tapering region 500, the required alignment accuracies in the exposure processes required for production of the fourth tapering region 500 are reduced.

FIG. 4 shows two highly schematized intensity profiles 530, 540 representing an intensity variation in the growth direction 404 of a laser mode that can be excited in the waveguide layer 440 of the semiconductor structure 400 of the fourth semiconductor laser 40. The first intensity profile 530 indicates the intensity variation of the laser mode that can be excited in the waveguide layer 440 at a position of the semiconductor structure 400 of the fourth semiconductor laser 40 lying outside the fourth tapering region 500. The second intensity profile 540 represents the intensity variation in the growth direction 404 close to the first side facet 401 of the semiconductor structure 400 of the fourth semiconductor laser 40.

From the intensity profiles 530, 540, it can be seen that the fourth tapering region 500 of the semiconductor structure 400 of the fourth semiconductor laser 40 modifies a laser mode that can be excited in the waveguide layer 440 of the semiconductor structure 400 in the longitudinal direction 403 toward the first side facet 401 to an extent such that an overlap between the laser mode that can be excited in the waveguide layer 440 and the active layer 430 of the semiconductor structure 400 decreases toward the first side facet 401. The effect of this is that laser radiation excited close to the first side facet 401 of the semiconductor structure 400 of the fourth semiconductor laser 40 in the waveguide layer 440 is absorbed only to a small extent. In the region of the first side facet 401 of the semiconductor structure 400 of the fourth semiconductor laser 40, therefore, nonradiative recombination and concomitant heating occur only to a small extent. In the fourth semiconductor laser 40, there is therefore only a small risk of optically induced damage. This makes it possible to operate the fourth semiconductor laser 40 with a high output optical power.

In the first semiconductor laser 10, in the second semiconductor laser 20, in the third semiconductor laser 30, and in the fourth semiconductor laser 40, a tapering region may likewise be formed in each case on the second side facet of the semiconductor structure 400 lying opposite the first side facet 401 of the semiconductor structure 400. This further tapering region may correspond mirror-symmetrically to the tapering region 100, 200, 300, 500 on the first side facet 401, or it may be configured in a different way thereto.

The features of the tapering regions 100, 200, 300, 500 of the semiconductor lasers 10, 20, 30, 40 may be combined with one another. In the fourth semiconductor laser 40, for example, the thickness 441 of the waveguide layer 440 and the thickness 461 of the second cladding layer 460 can increase more than linearly in the first subregion 510 and in the second subregion 520 of the fourth tapering region 500 as in the second tapering region 200 of the second semiconductor laser 20. The fourth tapering region 500 of the fourth semiconductor laser 40 can also have a step 350 as with the third tapering region 300 of the third semiconductor laser 30.

Our lasers and methods have been illustrated and described in detail with the aid of preferred examples. This disclosure is nevertheless not restricted to the examples disclosed. Rather, other variants may be derived therefrom by those skilled in the art, without departing from the protective scope of the appended claims.

This application claims priority of DE 10 2013 211 851.1, the disclosure of which is incorporated herein by reference.

The invention claimed is:

1. An edge-emitting semiconductor laser comprising a semiconductor structure having a waveguide layer with an embedded active layer,
    wherein the waveguide layer extends in a longitudinal direction between a first side facet and a second side facet of the semiconductor structure,
    the semiconductor structure has a tapering region adjacent to the first side facet,
    a thickness of the waveguide layer, measured perpendicularly to the longitudinal direction, in the tapering region increases along the longitudinal direction,
    the waveguide layer is arranged between a first cladding layer and a second cladding layer,
    a thickness of the second cladding layer, measured perpendicularly to the longitudinal direction, in the tapering region of the semiconductor structure increases in the longitudinal direction,
    the tapering region comprises a first subregion and a second subregion,
    the tapering region is configured as a chamfer extending from a step of the semiconductor structure to the first side facet of the semiconductor structure,
    the chamfer extends at least partially into the waveguide layer,
    the step is formed between the chamfer and an upper side of the semiconductor structure,
    a thickness, measured perpendicularly to the longitudinal direction, of a second cladding layer adjacent to the waveguide layer increases at the step,
    the first subregion is arranged closer to the first side facet than the second subregion,
    the thickness of the waveguide layer increases in the longitudinal direction in the first subregion,
    the thickness of the waveguide layer is constant in the longitudinal direction in the second subregion,
    the thickness of the second cladding layer increases in the longitudinal direction in the second subregion.

2. The edge-emitting semiconductor laser as claimed in claim 1, wherein the thickness of the waveguide layer increases linearly along the longitudinal direction.

3. The edge-emitting semiconductor laser as claimed in claim 1, wherein the thickness of the waveguide layer increases more than linearly along the longitudinal direction.

4. The edge-emitting semiconductor laser as claimed in claim 1,
    wherein the waveguide layer comprises a first waveguide sublayer and a second waveguide sublayer,
    the active layer is arranged between the first waveguide sublayer and the second waveguide sublayer, and
    a thickness of the second waveguide sublayer in the tapering region of the semiconductor structure increases along the longitudinal direction.

5. The edge-emitting semiconductor laser as claimed in claim 4, wherein a thickness of the first waveguide sublayer in the tapering region of the semiconductor structure is constant in the longitudinal direction.

6. The edge-emitting semiconductor laser as claimed in claim 1, wherein the third subregion has a length of 5 µm to 25 µm in the longitudinal direction.

7. The edge-emitting semiconductor laser as claimed in claim 1, wherein the first subregion has a length of 10 µm to 160 µm in the longitudinal direction.

8. The edge-emitting semiconductor laser as claimed in claim 1, wherein the waveguide layer has an embedded etch stop layer.

9. A method of producing an edge-emitting semiconductor laser comprising:

producing a semiconductor structure having a waveguide layer with an embedded active layer, the waveguide layer extending in a longitudinal direction between a first side facet and a second side facet of the semiconductor structure, wherein the waveguide layer is arranged between a first cladding layer and a second cladding layer; and partially removing the waveguide layer and the second cladding layer in a tapering region, adjacent to the first side facet, of the semiconductor structure such that a thickness, measured perpendicularly to the longitudinal direction, of the waveguide layer in the tapering region increases along the longitudinal direction and a thickness of the second cladding layer, measured perpendicularly to the longitudinal direction, in the tapering region of the semiconductor structure increases in the longitudinal direction, wherein the tapering region comprises a first subregion and a second subregion, removal of the waveguide layer is carried out by etching, the second cladding layer adjacent to the waveguide layer is removed uniformly throughout the tapering region in a first etching process, the waveguide layer is partially removed in a subsequent second etching process, the first subregion is arranged closer to the first side facet than the second subregion, the thickness of the waveguide layer increases in the longitudinal direction in the first subregion, the thickness of the waveguide layer is constant in the longitudinal direction in the second subregion, and the thickness of the second cladding layer increases in the longitudinal direction in the second subregion.

10. The method as claimed in claim 9, wherein removal of the waveguide layer is carried out as far as an etch stop layer embedded in the waveguide layer.

11. An edge-emitting semiconductor laser comprising a semiconductor structure having a waveguide layer with an embedded active layer, wherein the waveguide layer extends in a longitudinal direction between a first side facet and a second side facet of the semiconductor structure, the semiconductor structure has a tapering region adjacent to the first side facet, a thickness of the waveguide layer, measured perpendicularly to the longitudinal direction, in the tapering region increases along the longitudinal direction, the waveguide layer is arranged between a first cladding layer and a second cladding layer, a thickness of the second cladding layer, measured perpendicularly to the longitudinal direction, in the tapering region of the semiconductor structure increases in the longitudinal direction, the tapering region comprises a first subregion and a second subregion, the tapering region is configured as a chamfer, the chamfer extends at least partially into the waveguide layer, a step is formed between the chamfer and the upper side of the semiconductor structure, a thickness, measured perpendicularly to the longitudinal direction, of a second cladding layer adjacent to the waveguide layer increases at the step, the first subregion is arranged closer to the first side facet than the second subregion, the thickness of the waveguide layer increases in the longitudinal direction in the first subregion, the thickness of the waveguide layer is constant in the longitudinal direction in the second subregion, and the thickness of the second cladding layer increases in the longitudinal direction in the second subregion.

* * * * *